(12) United States Patent
Dietmar

(10) Patent No.: US 8,427,141 B2
(45) Date of Patent: Apr. 23, 2013

(54) METHOD AND DEVICE TO DETERMINE A RELATIVE POSITION USING A RESOLVER

(75) Inventor: Steidl Dietmar, Augsburg (DE)

(73) Assignee: Kuka Laboratories GmbH, Augsburg (DE)

( * ) Notice: Subject to any disclaimer, the term of this patent is extended or adjusted under 35 U.S.C. 154(b) by 628 days.

(21) Appl. No.: 12/691,363

(22) Filed: Jan. 21, 2010

(65) Prior Publication Data

US 2010/0207615 A1    Aug. 19, 2010

(30) Foreign Application Priority Data

Jan. 21, 2009  (DE) .......................... 10 2009 005 494

(51) Int. Cl.
*G01B 7/30* (2006.01)
(52) U.S. Cl.
USPC .................................................... 324/207.25
(58) Field of Classification Search .............. 324/207.25
See application file for complete search history.

(56) References Cited

U.S. PATENT DOCUMENTS

| | | | |
|---|---|---|---|
| 5,241,268 A | 8/1993 | Lee | |
| 5,684,719 A | 11/1997 | Anagnost | |
| 5,949,359 A | 9/1999 | Vlahu | |
| 6,571,194 B2 * | 5/2003 | Goto et al. | 702/151 |

FOREIGN PATENT DOCUMENTS

EP    1 498 698    1/2005

OTHER PUBLICATIONS

Improving the Accuracy of Low-Cost Resolver-Based Encoders Using Harmonic Analysis, Kaul et al. Nuclear Instruments and Methods in Physics Research A 586 (2008) pp. 345-355.

* cited by examiner

*Primary Examiner* — Reena Aurora
(74) *Attorney, Agent, or Firm* — Schiff Hardin LLP

(57) ABSTRACT

In a method according to the invention to determine the relative position (ρ) of a resolver, an exciter winding is excited with a reference signal, a first signal resulting from the reference signal in a first winding is sampled and a second signal resulting from the reference signal in a second winding is sampled, an uncompensated Fourier coefficient for the first signal is determined and an uncompensated Fourier coefficient for the second signal is determined. A compensated Fourier coefficient for the first signal and a compensated Fourier coefficient for the second signal is determined and the relative position of the resolver is determined from the compensated Fourier coefficients. The compensated Fourier coefficients essentially compensate the change of the uncompensated Fourier coefficients due to the phase shift of the resolver and/or the change of the relative position during the sampling.

14 Claims, 7 Drawing Sheets

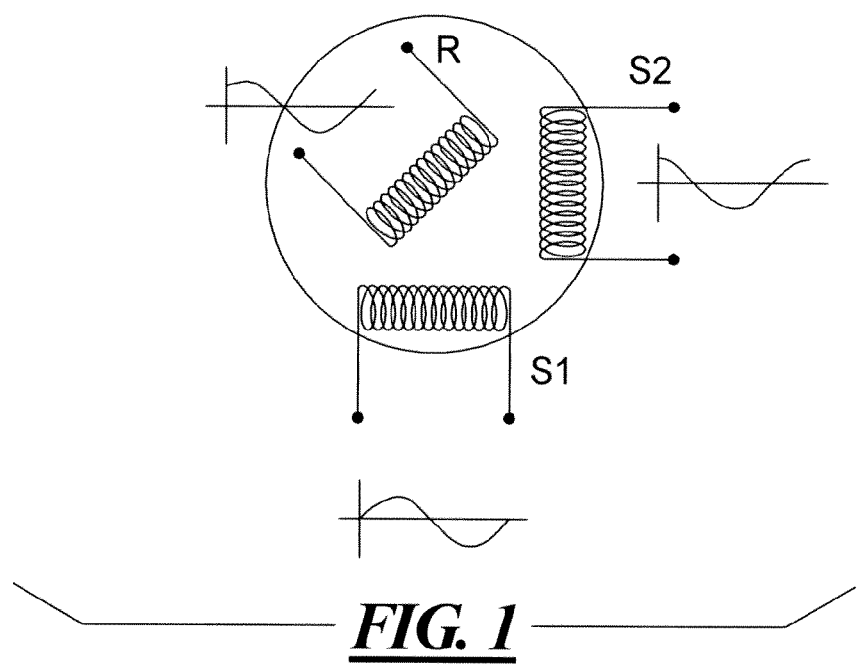
FIG. 1
FIG. 2
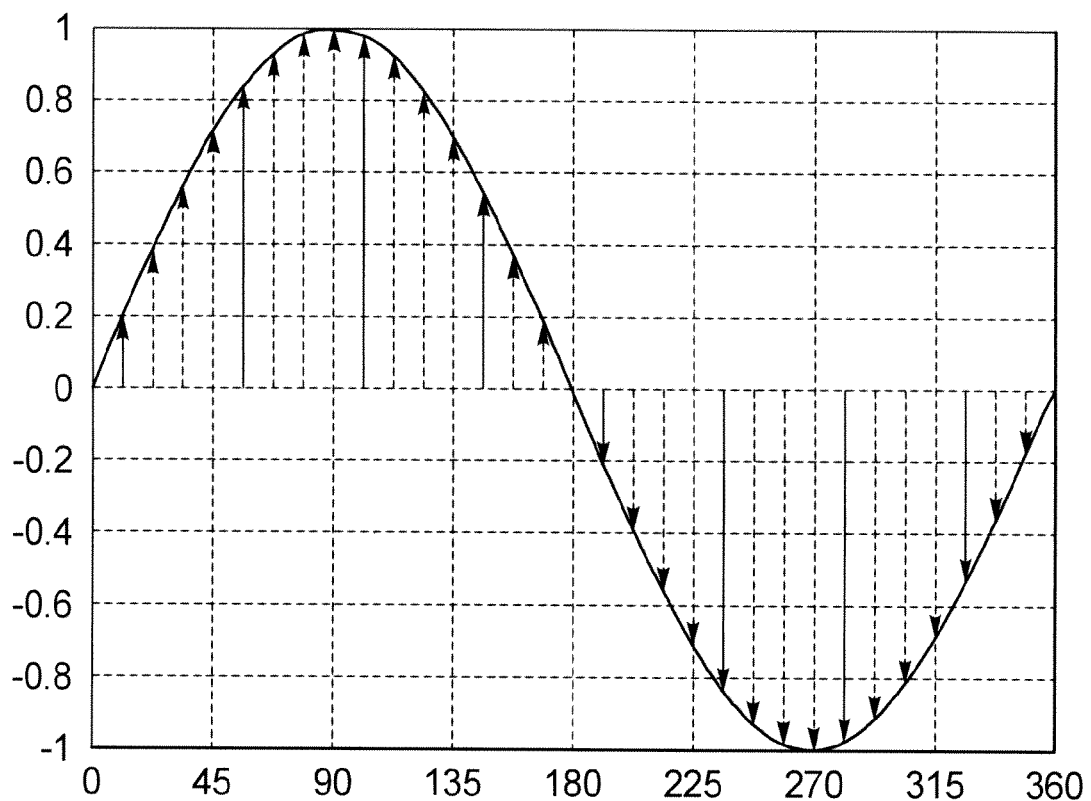

METHOD AND DEVICE TO DETERMINE A RELATIVE POSITION USING A RESOLVER

BACKGROUND OF THE INVENTION

1. Field of the Invention

The present invention concerns a method and a device to determine a relative position (angular position) by means of a resolver, in particular at high rotation speeds.

2. Description of the Prior Art

Resolvers are used in engineering, among other things, to detect the relative position of actuated or non-actuated pivot points, motors and the like. In robotics, the evaluation of the resolver signals is accorded particular importance since they decisively influence the performance and the positioning precision of the robot.

A known design of a resolver includes two stator windings offset by 90° that enclose a rotatably supported rotor with a rotor winding. Other resolver designs employ two windings arranged offset from one another and activated by a stator winding, or make use of variable magnetic resistance (as known from EP 0 877 464 A2).

The rotor of the resolver is activated by a reference sine signal of the form $U(t)=U_R \cdot \sin(2\pi \cdot f \cdot t)$ with the amplitude $U_R$ and the frequency f that induces voltages of different amplitude in the stator windings S1 and S2 depending on the rotor position. If $\rho$ designates the defined angle of the rotor as shown in FIG. 1, the voltage $$U_{S1}(t)=C_{TF} \cdot U_R \cdot \sin(2\pi \cdot f \cdot t + \phi_R) \cdot \cos \rho = U_{S1,Amp} \cdot \sin(2\pi \cdot f \cdot t + \phi_R), \quad (1)$$

results for S1 and the voltage $$U_{S2}(t)=C_{TF} \cdot U_R \cdot \sin(2\pi \cdot f \cdot t + \phi_R) \cdot \sin \rho = U_{S2,Amp} \cdot \sin(2\pi \cdot f \cdot t + \phi_R). \quad (2)$$

results for S2.

The two induced voltages are thus theoretically identical in frequency f and phase but can be shifted in phase by $\phi_R$ relative to the reference sine with which the rotor winding is activated, wherein $C_{TF}$ designates the transmission factor. The angle $\rho$ of the resolver can thus be determined by $$\rho = \arctan\left(\frac{C_{TF} \cdot U_R \cdot \sin\rho}{C_{TF} \cdot U_R \cdot \cos\rho}\right) = \arctan\left(\frac{U_{S2,Amp}}{U_{S1,Amp}}\right) \quad (3)$$

An optimally precise determination of the amplitudes $U_{S1,Amp}$ and $U_{S2,Amp}$ is thus important for a good position signal.

In addition to the conventional sampling of the voltages $U_{S1}(t)$, $U_{S2}(t)$ in the range of their extremes (in which $U_S(t) \approx U_{S,Amp}$ applies), difficulties exist due to the sensitivity regarding the sampling point in time. From U.S. Pat. No. 5,241,268 it is known to implement a Fourier transformation of the voltages $U_{S1}(t)$, $U_{S2}(t)$ in order to determine the amplitudes $U_{S1,Amp}$ and $U_{S2,Amp}$ (and thus the rotor angle $\rho$) more reliably and precisely.

For this purpose, the voltage signals $U_{S1}(t)$, $U_{S2}(t)$ are sampled equidistantly. The calculation of the amplitude of these N time-discrete sample values then ensues by means of (for example) discrete Fourier transformation, which transforms a time signal into a frequency range. The complex Fourier coefficients $\hat{a}=(\hat{a}_0, \ldots, \hat{a}_{N-1})$ are calculated from the time-discrete sample values $a=(a_0, \ldots, a_{N-1})$ according to:

$$\hat{a}_k = \frac{1}{N}\sum_{j=0}^{N-1} e^{-i2\pi \frac{jk}{N}} \cdot a_j \text{ for } k=0,\ldots,N-1 \quad (4)$$

The Fourier coefficient $\hat{a}_k$ at the frequency of the resolver signal contains the amplitude $2 \cdot |\hat{a}_k|$ as well as the phase $\angle(\hat{a}_k)$ of the sampled signal. Which of the coefficients corresponds to the exciter signal depends on the number of full waves across which the Fourier transformation is calculated. If it is one full wave, the first coefficient is calculated and Equation (4) is simplified as:

$$\hat{a}_1 = \frac{1}{N}\sum_{j=0}^{N-1} e^{-i2\pi \frac{j}{N}} \cdot a_j \quad (5)$$

Given two full waves, the second coefficient is accordingly calculated, given three full waves the third coefficient etc.

Equation (5) can also be represented with separate real part and imaginary part with the aid of the Euler formula $e^{i\theta}=\cos\theta+i\sin\theta$:

$$\hat{a}_1 = \frac{1}{N}\sum_{j=0}^{N-1}\cos(2\pi \cdot j/N) \cdot a_j - i\frac{1}{N}\sum_{j=0}^{N-1}\sin(2\pi \cdot j/N) \cdot a_j \quad (6)$$

The Fourier coefficient from Equation (6) is to be calculated for both $U_{S1}(t)$ and $U_{S2}(t)$.

To solve Equation (3) a complex division $$\frac{z_{S1}}{z_{S2}} = \frac{\hat{a}_{1,S1}}{\hat{a}_{1,S2}} = \frac{x_{S1}+iy_{S1}}{x_{S2}+iy_{S2}} = \frac{x_{S1}x_{S2}+y_{S1}y_{S2}}{x_{S2}^2+y_{S2}^2} + i\frac{x_{S2}y_{S1}-x_{S1}y_{S2}}{x_{S2}^2+y_{S2}^2} \quad (7)$$

of the two (complex) Fourier coefficients $z_{S1}$, $z_{S2}$ that result for the two voltage signals $U_{S1}(t)$, $U_{S2}(t)$ can be taken into account. The absolute value of this complex number, i.e. the real part according to Equation (7), corresponds to the quotient of the amplitudes to be used in Equation (3).

However, the determined position disadvantageously becomes increasingly more imprecise with increasing rotor rotation sped. It has been shown that the determined deviation is approximately linearly dependent on h rotation speed and approximately sinusoidal relative to the phase displacement of the resolver. This is shown in FIG. 6 in which the deviation is plotted in increments over the phase displacement of the resolver (increasing from left to right in FIG. 6) and the rotation speed of the resolver (increasing from front to back in FIG. 6). In addition to this position deviation, the jitter of the position also increases massively, as this is shown by way of example in FIG. 7 in which peak-to-peak values of the jitter are plotted over the phase displacement of the resolver (increasing from left to right in FIG. 7) and the rotation speed of the resolver (increasing from front to back in FIG. 7).

SUMMARY OF THE INVENTION

The invention is based on the insight that the above-described effect is significantly due to the fact that the position of the rotor changes significantly within a Fourier interval at high motor rotation speeds. A large change of the amplitude of the envelope that is sampled to determine the amplitudes thereby arises. FIG. 8 shows two signals that are shifted in phase but have the same envelope. It can be seen that the sine signal weighted the envelope, so to speak. This means that amplitude values of the envelope at the extreme points of the sine are more strongly weighted in the calculation than other values. In contrast to this, the amplitude of the envelope cannot be evaluated at all at the zeros. This weighting has the effect that the amplitude of the envelope is obtained not in the middle of the Fourier interval in the Fourier transformation but rather at a point in time shifted somewhat to the left or right.

Since the calculation according to Equation (7) additionally assumes that the theoretically identical phases are essentially eliminated, a further adulteration of the relative position results since the phase positions of the Fourier coefficients are shifted by the significant change of the envelope during a sampling interval. They therefore no longer lie on one of the straight lines from FIG. 3 and consequently cause a deviation.

Accordingly shown in FIGS. 6 and 7 is an increasing position deviation or increasing jitter given rising rotation speed, thus a greater change of the relative position and given greater phase shifts of the resolver.

It is therefore an object of the present invention to enable a more precise detection of the relative position of a resolver, in particular even at higher rotation speeds.

According to the invention, the determination of the relative position of the resolver ensues with the following steps: an excitation winding (for example a rotor winding) is excited with an (in particular periodical) reference signal. An (in particular induced) first signal resulting from the reference signal in a first winding (for example a first stator winding) is sampled and an (in particular induced) second signal resulting from the reference signal in a second winding (for example a second stator winding) is sampled. Uncompensated Fourier coefficients for the first and second signal are initially determined from these.

Before the relative position of the resolver is determined from the Fourier coefficients for the first signal and for the second signal, the Fourier coefficients are compensated such that the change of the Fourier coefficients of the sampled envelopes of the first and second signal are essentially compensated based on the phase shift of the resolver and/or the change of the relative position during the sampling.

If the case of N samples per full wave is considered (without limitation of generality) and a straight line is assumed as an envelope for simplicity, the curve shown in FIG. 8 can be described by $$y = \left(t + m\left(x + \frac{1}{N}\pi\right)\right) \cdot \cos(x + x_c) \quad (8)$$

wherein t designates the amplitude at $-\pi/N$, m designates the slope of the envelope and $x_c$ designates the phase shift of the resolver. If this function is applied to the Fourier transformation, the integral $$\frac{1}{2\pi}\int_{-\frac{\pi}{N}}^{2\pi-\frac{\pi}{N}} \left(t + m\left(x + \frac{1}{N}\pi\right)\right) \cdot \cos(x + x_c) \cdot e^{-ix} dx \quad (9)$$

is to be solved to determine the Fourier coefficients necessary to calculation the quotient according to Equation (3). The limits of the integral are shifted by $-\pi/N$ since the values of the discrete Fourier transformation are not symmetrical around $\pi$ but rather are distributed around $$\left(1 - \frac{1}{N}\right) \cdot \pi$$

given N coefficients. With the aid of the Euler formula $$\cos\theta = \frac{1}{2}(e^{i\theta} + e^{-i\theta}),$$

Equation (9) can be reformulated as $$\frac{1}{2\pi}\int_{-\frac{\pi}{N}}^{2\pi-\frac{\pi}{N}} \left(t + m\left(x + \frac{1}{N}\pi\right) + \frac{1}{2}\right) \cdot (e^{i(x+x_c)} + e^{-i(x+x_c)}) \cdot e^{-ix} dx \quad (10)$$

$$= \frac{1}{4\pi}\int_{-\frac{\pi}{N}}^{2\pi-\frac{\pi}{N}} \left(\left(t + \frac{m\pi}{N}\right) + mx\right) \cdot (e^{ix_c} + e^{-i(2x+x_c)}) dx$$

Four integrals are to be solved to solve this Equation (10) (for better readability the constant $$t + \frac{m\pi}{N}$$

is abbreviated as $t_0$):

$$\frac{1}{4\pi}\left[\int_{-\frac{\pi}{N}}^{2\pi-\frac{\pi}{N}} t_0 \cdot e^{ix_c} dx + \int_{-\frac{\pi}{N}}^{2\pi-\frac{\pi}{N}} mx \cdot e^{ix_c} dx + \int_{-\frac{\pi}{N}}^{2\pi-\frac{\pi}{N}} t_0 \cdot e^{-i(2x+x_c)} dx + \int_{-\frac{\pi}{N}}^{2\pi-\frac{\pi}{N}} mx \cdot e^{-i(2x+x_c)} dx\right] \quad (11)$$

The auxiliary calculation

1. $$\frac{1}{4\pi}\left[\int_{-\frac{\pi}{N}}^{2\pi-\frac{\pi}{N}} t_0 \cdot e^{ix_c} dx + \int_{-\frac{\pi}{N}}^{2\pi-\frac{\pi}{N}} mx \cdot e^{ix_c} dx + \int_{-\frac{\pi}{N}}^{2\pi-\frac{\pi}{N}} t_0 \cdot e^{-i(2x+x_c)} dx + \int_{-\frac{\pi}{N}}^{2\pi-\frac{\pi}{N}} mx \cdot e^{-i(2x+x_c)} dx\right]$$

2. $$\int_{-\frac{\pi}{N}}^{2\pi-\frac{\pi}{N}} mx \cdot e^{ix_c} dx =$$
$$m \cdot e^{ix_c} \int_{-\frac{\pi}{N}}^{2\pi-\frac{\pi}{N}} x dx = m \cdot e^{ix_c} \left[\frac{1}{2}x^2\right]_{-\frac{\pi}{N}}^{2\pi-\frac{\pi}{N}} = \left(1 - \frac{1}{N}\right) \cdot 2\pi^2 m \cdot e^{ix_c}$$

3. $$\int_{-\frac{\pi}{N}}^{2\pi-\frac{\pi}{N}} t_0 \cdot e^{-i(2x+x_c)} dx =$$
$$t_0 \cdot e^{-ix_c} \int_{-\frac{\pi}{N}}^{2\pi-\frac{\pi}{N}} e^{-2ix} dx = t_0 \cdot e^{-ix_c} \cdot \left[\frac{1}{-2ix}e^{-2ix}\right]_{-\frac{\pi}{N}}^{2\pi-\frac{\pi}{N}} = 0$$

-continued $$\int_{-\frac{\pi}{N}}^{2\pi-\frac{\pi}{N}} mx \cdot e^{-i(2x+x_c)} dx =$$  (4.)

$$m \cdot e^{-ix_c} \int_{-\frac{\pi}{N}}^{2\pi-\frac{\pi}{N}} x \cdot e^{-2ix} dx = m \cdot e^{-ix_c} \left[ \frac{e^{-2ix}}{(-2i)^2}(-2ix-1) \right]_{-\frac{\pi}{N}}^{2\pi-\frac{\pi}{N}} =$$

$$= m \cdot e^{-ix_c} \left[ \frac{e^{-2ix}}{4}(2ix+1) \right]_{-\frac{\pi}{N}}^{2\pi-\frac{\pi}{N}} =$$

$$m \cdot e^{-ix_c} e^{i\frac{2\pi}{N}} i \left[ \frac{x}{2} \right]_{-\frac{\pi}{N}}^{2\pi-\frac{\pi}{N}} = m\pi \cdot e^{i\left(\left(\frac{2}{N}+\frac{1}{2}\right)\pi - x_c\right)},$$

used in Equation (11), leads to:

$$\frac{1}{4\pi} \left[ 2\pi t_0 \cdot e^{ix_c} + \left(1 - \frac{1}{N}\right) \cdot 2\pi^2 m \cdot e^{ix_c} + 0 + m\pi \cdot e^{i\left(\left(\frac{2}{N}+\frac{1}{2}\right)\pi - x_c\right)} \right] =$$  (12)

$$= \frac{1}{2}\left(t_0 + \left(1 - \frac{1}{N}\right) \cdot \pi m\right) \cdot e^{ix_c} + \frac{1}{4} m \cdot e^{i\left(\left(\frac{2}{N}+\frac{1}{2}\right)\pi - x_c\right)} =$$

$$= \frac{1}{2}(t + \pi m) \cdot e^{ix_c} + \frac{1}{4} m \cdot e^{i\left(\left(\frac{2}{N}+\frac{1}{2}\right)\pi - x_c\right)}$$

The first term $$\frac{1}{2}(t + \pi m) \cdot e^{ix_c}$$

in Equation (12) is the desired part; the phase of this complex number corresponds to the phase position of the resolver. The absolute value corresponds to half the amplitude of the envelope at $$\left(1 - \frac{1}{N}\right) \cdot \pi.$$

The factor ½ results from the fact that a cosine signal respectively has a half fraction at the frequency f and a half fraction at −f. That can also be recognized in the Euler formula $$\cos\theta = \frac{1}{2}(e^{i\theta} + e^{-i\theta}),$$

for example.
The second term $$\frac{1}{4} m \cdot e^{i\left(\left(\frac{2}{N}+\frac{1}{2}\right)\pi - x_c\right)}$$

in Equation (12) is responsible for the unwanted deviation. On the one hand it has the effect that the straight lines shown in FIG. 3 (explained in detail in the following) degenerate into ellipses that open up ever further with rising rotation speed. The jitter thereby increases (see FIG. 7) since the evaluation of Equation (7) is based on the fact that the phase position of S1 and the phase position of S2 are identical. Due to this shift of the phase position of the Fourier coefficients, the complex quotient according to Equation (7) rotates out of the 0° position and possesses an imaginary part that is disregarded in the evaluation of Equation (7). On the other hand, the second term in Equation (12) changes the absolute value of the Fourier coefficients and therefore leads to the position deviation shown in FIG. 6.

In Equation (12) the term $$\frac{1}{2} t \cdot e^{ix_c}$$

corresponds to the correct Fourier coefficients of a half wave before, i.e. a Fourier coefficient of a half wave before in which the deviation is compensated. If the difference of the uncompensated, new Fourier coefficients and the old, already-compensated Fourier coefficients is thus calculated, $$\frac{1}{2}\pi m \cdot e^{ix_c} + \frac{1}{4} m \cdot e^{i\left(\left(\frac{2}{N}+\frac{1}{2}\right)\pi - x_c\right)}$$  (13)

is thus obtained.
The absolute value of the desired portion of the difference is thus greater by precisely $$\frac{1}{2}\pi m \cdot \bigg/ \frac{1}{4} m \cdot = \cdot 2\pi$$

than the absolute value of the deviation. The angle of the deviation at N=8 is, for example, 135°−$x_c$, thus proceeds precisely in the direction of the usable signal at +67.5° and opposite to this at −22.5°. At +22.5° and −67.5° the deviation is perpendicular to the usable signal. FIG. 9 shows in this regard the direction of usable portion and deviation for different resolver phase shifts given N=8 by way of example.

If the complex number according to Equation (13) is rotated in the number plane by π/N (which corresponds to a multiplication with $$e^{-i\frac{\pi}{N}}),$$

$$\frac{1}{2}\pi m \cdot e^{i\left(x_c - \frac{\pi}{N}\right)} + \frac{1}{4} m \cdot e^{i\left(\frac{1}{2}\pi - \left(x_c - \frac{\pi}{N}\right)\right)}$$  (14)

is obtained. The deviation can be determined from this sum. FIG. 10 shows in this regard a drawing for clarification, wherein here $$x_c - \frac{\pi}{N}$$

is abbreviated as φ. Since the deviation has the angle 90°−φ, the angle also rises in the right, upper small triangle in FIG. 10. Therefore it applies that $$\overline{X_{Nutz}} = 2\pi \cdot \overline{Y_{Abw}}, \text{ and } \overline{Y_{Nutz}} = 2\pi \cdot \overline{X_{Abw}}$$  (15)

The known variables $\overline{X_{DFT}}$ and $\overline{Y_{DFT}}$ can thus be expressed by:

$$\overline{X_{DFT}} = \overline{X_{Abw}} + \overline{X_{Nutz}} = \overline{X_{Abw}} + 2\pi \cdot \overline{Y_{Abw}}$$

$$\overline{Y_{DFT}} = \overline{Y_{Abw}} + \overline{Y_{Nutz}} = \overline{Y_{Abw}} + 2\pi \cdot \overline{X_{Abw}}$$  (16)

That is a linear equation system. With $\overline{X_{Abw}} = \overline{X_{DFT}} - 2\pi \cdot \overline{Y_{Abw}}$ and $\overline{Y_{Abw}} = \overline{Y_{DFT}} - 2\pi \cdot \overline{X_{Abw}}$ it follows that $$\overline{X_{DFT}} = \overline{X_{Abw}} + 2\pi \cdot (\overline{Y_{DFT}} - 2\pi \cdot \overline{X_{Abw}}) \Rightarrow \overline{X_{Abw}} = \frac{2\pi \cdot \overline{Y_{DFT}} - \overline{X_{DFT}}}{4\pi^2 - 1} \quad (17)$$

$$\overline{Y_{DFT}} = \overline{Y_{Abw}} + 2\pi \cdot (\overline{X_{DFT}} - 2\pi \cdot \overline{Y_{Abw}}) \Rightarrow \overline{Y_{Abw}} = \frac{2\pi \cdot \overline{X_{DFT}} - \overline{Y_{DFT}}}{4\pi^2 - 1}$$

The deviation must then be rotated back again by $\pi/N$, counterclockwise. These three steps can advantageously be combined. If $X_{DFT} + i \cdot Y_{DFT}$ is the difference of the uncompensated new Fourier coefficients and the already-compensated old, via rotation with $$e^{-i\frac{\pi}{N}}$$

$$\overline{X_{DFT}} + i \cdot \overline{Y_{DFT}} = (X_{DFT} + i \cdot Y_{DFT}) \cdot e^{-i\frac{\pi}{N}} \quad (18)$$

$$= (X_{DFT} + i \cdot Y_{DFT}) \cdot \left(\cos\frac{\pi}{N} - i \cdot \sin\frac{\pi}{N}\right)$$

$$\overline{X_{DFT}} = X_{DFT} \cdot \cos\frac{\pi}{N} + Y_{DFT} \cdot \sin\frac{\pi}{N}$$

$$\overline{Y_{DFT}} = Y_{DFT} \cdot \cos\frac{\pi}{N} - X_{DFT} \cdot \sin\frac{\pi}{N}$$

is obtained.
Used in Equation (17), this yields:

$$\overline{X_{Abw}} = \frac{2\pi \cdot \left(Y_{DFT} \cdot \cos\frac{\pi}{N} - X_{DFT} \cdot \sin\frac{\pi}{N}\right) - \left(X_{DFT} \cdot \cos\frac{\pi}{N} + Y_{DFT} \cdot \sin\frac{\pi}{N}\right)}{4\pi^2 - 1} \quad (19)$$

$$= \frac{\left(2\pi \cdot \cos\frac{\pi}{N} - \sin\frac{\pi}{N}\right) \cdot Y_{DFT} - \left(2\pi \cdot \sin\frac{\pi}{N} + \cos\frac{\pi}{N}\right) \cdot X_{DFT}}{4\pi^2 - 1}$$

$$\overline{Y_{Abw}} = \frac{2\pi \cdot \left(X_{DFT} \cdot \cos\frac{\pi}{N} + Y_{DFT} \cdot \sin\frac{\pi}{N}\right) - \left(Y_{DFT} \cdot \cos\frac{\pi}{N} - X_{DFT} \cdot \sin\frac{\pi}{N}\right)}{4\pi^2 - 1}$$

$$= \frac{\left(2\pi \cdot \cos\frac{\pi}{N} + \sin\frac{\pi}{N}\right) \cdot X_{DFT} + \left(2\pi \cdot \sin\frac{\pi}{N} - \cos\frac{\pi}{N}\right) \cdot Y_{DFT}}{4\pi^2 - 1}$$

Rotation of this deviation back ensues via multiplication with $$e^{j\frac{\pi}{N}}:$$

$$X_{Abw} + i \cdot Y_{Abw} = (\overline{X_{Abw}} + i \cdot \overline{Y_{Abw}}) \cdot e^{-i\frac{\pi}{N}} \quad (20)$$

$$= (\overline{X_{Abw}} + i \cdot \overline{Y_{Abw}}) \cdot \left(\cos\frac{\pi}{N} + i \cdot \sin\frac{\pi}{N}\right)$$

$$X_{Abw} = \overline{X_{Abw}} \cdot \cos\frac{\pi}{N} - \overline{Y_{Abw}} \cdot \sin\frac{\pi}{N}$$

$$Y_{Abw} = \overline{Y_{Abw}} \cdot \cos\frac{\pi}{N} + \overline{X_{Abw}} \cdot \sin\frac{\pi}{N}$$

With equation (19) thus yields:

$$X_{Abw} = \frac{\left(2\pi \cdot \cos\frac{\pi}{N} - \sin\frac{\pi}{N}\right) \cdot Y_{DFT} - \left(2\pi \cdot \sin\frac{\pi}{N} + \cos\frac{\pi}{N}\right) \cdot X_{DFT}}{4\pi^2 - 1} \cdot \cos\frac{\pi}{N} - \frac{\left(2\pi \cdot \cos\frac{\pi}{N} + \sin\frac{\pi}{N}\right) \cdot X_{DFT} + \left(2\pi \cdot \sin\frac{\pi}{N} - \cos\frac{\pi}{N}\right) \cdot Y_{DFT}}{4\pi^2 - 1} \cdot \sin\frac{\pi}{N} \quad (21)$$

$$= \frac{2\pi \cdot \left(\cos^2\frac{\pi}{N} - \sin^2\frac{\pi}{N}\right) \cdot Y_{DFT} - \left(4\pi \cdot \sin\frac{\pi}{N} \cdot \cos\frac{\pi}{N} + 1\right) \cdot X_{DFT}}{4\pi^2 - 1}$$

$$= \frac{2\pi \cdot \cos\frac{2\pi}{N} \cdot Y_{DFT} - \left(2\pi \cdot \sin\frac{2\pi}{N} + 1\right) \cdot X_{DFT}}{4\pi^2 - 1}$$

$$Y_{Abw} = \frac{\left(2\pi \cdot \cos\frac{\pi}{N} + \sin\frac{\pi}{N}\right) \cdot X_{DFT} + \left(2\pi \cdot \sin\frac{\pi}{N} - \cos\frac{\pi}{N}\right) \cdot Y_{DFT}}{4\pi^2 - 1} \cdot \cos\frac{\pi}{N} + \frac{\left(2\pi \cdot \cos\frac{\pi}{N} - \sin\frac{\pi}{N}\right) \cdot Y_{DFT} - \left(2\pi \cdot \sin\frac{\pi}{N} + \cos\frac{\pi}{N}\right) \cdot X_{DFT}}{4\pi^2 - 1} \cdot \sin\frac{\pi}{N}$$

$$= \frac{2\pi \cdot \left(\cos^2\frac{\pi}{N} - \sin^2\frac{\pi}{N}\right) \cdot X_{DFT} + \left(4\pi \cdot \sin\frac{\pi}{N} \cdot \cos\frac{\pi}{N} - 1\right) \cdot Y_{DFT}}{4\pi^2 - 1}$$

$$= \frac{2\pi \cdot \cos\frac{2\pi}{N} \cdot X_{DFT} + \left(2\pi \cdot \sin\frac{2\pi}{N} - 1\right) \cdot Y_{DFT}}{4\pi^2 - 1}$$

Except for and $X_{DFT}$ and $Y_{DFT}$, these are hereby only constants. The calculation is thus advantageously simple in design. FIG. 11 schematically shows the mode of operation of the compensation.

The ellipse represents the uncompensated values; the straight line represents the compensated. Equation (21) now yields the correction vectors leading back to the straight lines from the difference vectors starting from said straight lines.

According to the invention, the current Fourier coefficients that result from the sampling are therefore compensated with complex compensation vectors with real and imaginary parts according to Equation (21) that result from the difference $X_{DFT} + i \cdot Y_{DFT}$ of the respective current, uncompensated Fourier coefficients and a compensated Fourier coefficient that has been determined for a preceding sample time period (for example a half wave before or one sample value before).

As the comparison of FIG. 3, 11 shows, with method according to the invention the deviation resulting from the variation of the rotor position and the sampling of the envelope of the different rotor positions is compensated and the Fourier coefficient from which the relative position is determined is returned to the theoretical straight line.

FIG. 12 and FIG. 13 show (in a presentation corresponding to FIG. 6, 7) the deviation of the position (in increments) or, respectively, the jitter (in peak-to-peak values) over the phase shift of the resolver (increasing from left to right in FIG. 12, 13) and the rotation speed of the resolver (increasing from front to back in FIG. 12, 13) with the correction of the Fourier coefficients according to the invention. It is recognized that, although the deviation has not disappeared, it is decreased to approximately ⅛. The jitter is compensated very well and, even at high rotation speeds, is no more than during downtime.

In the preceding the compensation of the change of the uncompensated Fourier coefficients according to the invention was explained on the basis of a linear envelope. However, the compensation can also similarly be based on a trigonometric (in particular sinusoidal) envelope which, although it increases the cost, more precisely approximates the envelope.

A compensated Fourier coefficient on the basis of the difference of the uncompensated Fourier coefficient and a compensated Fourier coefficient that has been determined for a preceding sampling time period is advantageously determined for the first and second signal. For example, Fourier coefficients that result given sampling at a still-stationary resolver and/or without phase shift can be selected as start values for a method according to the invention.

The preceding sampling time period can comprise one or multiples of a sampling period with which the first and second signal are sampled, such that a compensation according to the invention can in particular also be implemented after every sample value; i.e., the preceding sampling time period used to calculation the difference corresponds directly to the reciprocal of the frequency of the sampling.

The sampling time period can similarly comprise half a period of the first and second signal (in particular in order to reduce the computational cost), i.e. the compensation according to the invention can be implemented after a half wave.

BRIEF DESCRIPTION OF THE DRAWINGS

FIG. 1 schematically illustrates a resolver.

FIG. 2 shows the sampling of a signal of a resolver channel at discrete, equidistant points in time.

DESCRIPTION OF THE PREFERRED EMBODIMENTS

Figure 3:
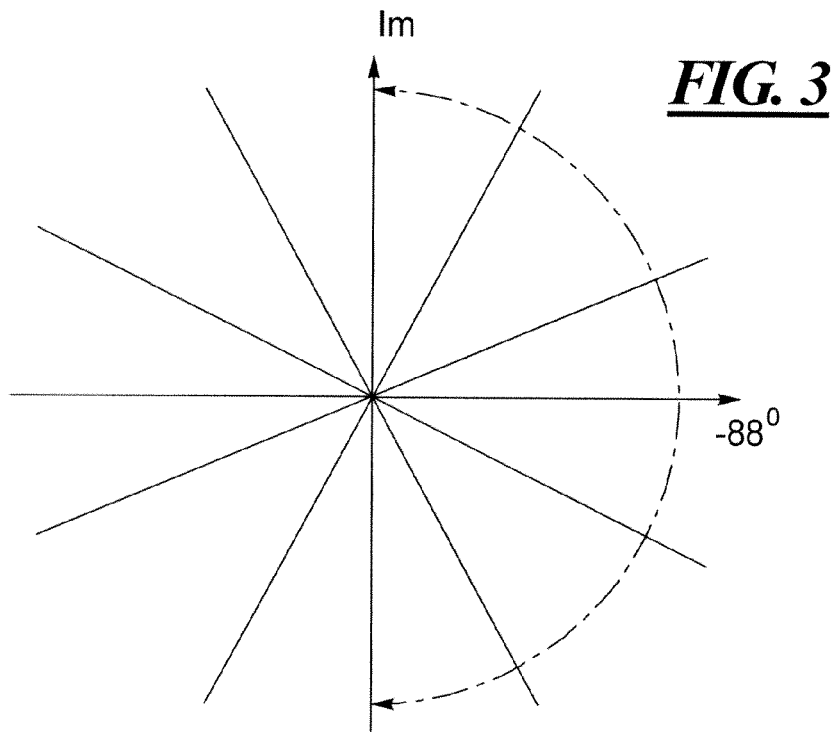
FIG. 3 shows the position of Fourier coefficients for different phase shifts of the resolver from FIG. 1.

FIG. 1 shows the principle design of a resolver whose relative position is determined according to a method according to an embodiment of the present invention.

In a cylindrical housing, two stator windings offset by 90° are arranged that enclose a rotor with the rotor winding R that is supported in the housing. This rotor is fed by a reference sine signal $U(t)=U_R \cdot \sin(2\pi \cdot f \cdot t)$ that induces voltages of different amplitude in the stator windings S1 and S2 depending on the rotor position. The angle ρ of the resolver can be determined according to (3) by $$\rho = \arctan\left(\frac{\sin\rho}{\cos\rho}\right) = \arctan\left(\frac{U_{S2,Amp}}{U_{S1,Amp}}\right) \quad (3)$$

According to the method according to one embodiment of the present invention, the amplitude signals $U_{S1,Amp}$ and $U_{S2,Amp}$ are sampled equidistantly as this is indicated in FIG. 2. For clarification, in FIG. 2 the sampling points in time of three other resolver channels are additionally drawn with dashed lines.

Advantageously, none of the sample values must actually hit the maximum or minimum of the signal. Due to the Nyquist-Shannon sampling theorem it is advantageous to sample the continuous, bandwidth-limited signal with a minimal frequency of 0 Hz and a maximal frequency $f_{max}$ with a frequency greater than $2 \cdot f_{max}$ in order to be able to approximate the original signal with arbitrary precision from the time-discrete signal that is obtained in this way. Due to the achievable slope and the corresponding effort in the upstream anti-aliasing filter, it is preferred to sample with at least $2.5 \cdot f_{max}$. In the exemplary embodiment, this maximal frequency $f_{max}$ corresponds to essentially the frequency of the exciter signal.

The calculation of the amplitude of these time-discrete sample values ensues by means of the discrete Fourier transformation. This transformation is a special case of the z-transformation with values for z on the unit circle. As shown in FIG. 2, in the exemplary embodiment exactly one full wave is sampled so that only the coefficient $\hat{a}_1$ according to Equation (6) must be calculated. Alternatively, multiples of the period 1/f of the reference sine signal $U(t)=U_R \cdot \sin(2\pi \cdot f \cdot t)$ can also be sampled.

The cosine and sine values in Equation (6) are constants for a fixed sample interval and a constant sample frequency and can be stored in a table in program code. The calculation of a Fourier coefficient therefore advantageously essentially consists of two multiplications and two additions per sample value.

To calculate the resolver angle, the amplitudes of the two signals S1 and S2 are required. Two complex Fourier coefficients must therefore be determined.

The position determination initially occurs only in the first octant, i.e. between 0° and 45°. Negative operational signs are removed and stored for a subsequently described octant determination. If the square of the amplitude of S2 is greater than that of S1 (i.e. if the angle is greater than 45°), the two values are exchanged and this information is likewise stored for the subsequently described octant determination.

For position calculation, a trigonometric function is now applied that is implemented in a processor, preferably via a table with linear interpolation. The tangent lies in the range from 0° to 45°, relatively close to a straight line; it can thus be linearly interpolated well. To calculate Equation (3), the quotient of the two amplitudes (thus the absolute values of the Fourier coefficients) is therefore initially calculated. In order to avoid a complicated and imprecise absolute value calculation, the fact can be utilized that S1 and S2 possess the same phase position. The complex division according to Equation (7) can thus be included in the calculation since the absolute values are hereby divided and the phases are subtracted (thus are zeroed). Therefore only the real part of Equation (7) is required; the imaginary part should be zeroed. To increase the certainty, the numerator of the imaginary part should be checked; it should be approximately zero.

The denominator of the real part corresponds to the already-calculated squared amplitude. Since the numerator is always smaller than or equal to the denominator, the quotient is between 1 and 0 and a division by 0 cannot occur. The calculated angle is thus between 0° and 45°.

In order to expand this angle to a range from 0° to 360°, it is subsequently determined in which of the eight octants the rotor is presently located. For this in principle three signals are necessary that in combination carry sufficient information ($8=2^3$). It should hereby be ensured that the transitions between the octants occur consistently in every case, i.e. without a jump.

In principle the information of in which of the eight octants the rotor is presently located can be determined from, for example, the algebraic sign of the amplitude of S1, the algebraic sign of the amplitude of S2 and the comparison of the squares of the amplitudes S1 and S2.

The allowed range of the phase shift of the resolver is to be taken into account in the determination of the algebraic sign of the amplitudes of S1 and S2. Since the phase shift of a single resolver is relatively constant, the Fourier transformation delivers coefficients that are all located on a straight line through the origin. FIG. 3 shows such a straight line for resolvers with different phase shifts. Given the inversion of the algebraic sign, the complex coefficient wanders through the origin and experiences a phase jump of 180° here.

If the allowed range of the resolver phase shift is defined at −90° to +90° (as this is indicated by the dash-dot double arrow in FIG. 3), the algebraic sign of the amplitude can simply be determined by the algebraic sign of the real part of the complex coefficient.

However coefficients near the origin are problematical, especially given greater phase shifts. Here the coefficient can incorrectly come into the other region due to interference and noise. However, this should not lead to discontinuities in the position determination.

Therefore the algebraic signs of S1 and S2 are not used directly for octant determination; rather the algebraic sign of the quotient is on the one hand. If one coefficient is very small, the other is always large. Via the complex division, the large coefficient rotates the small coefficient out of the problematical region. The second algebraic sign results from the denominator of the quotient since this is always greater than sin 45°, i.e. is approximately 70% and offers reliable information.

Figure 4:
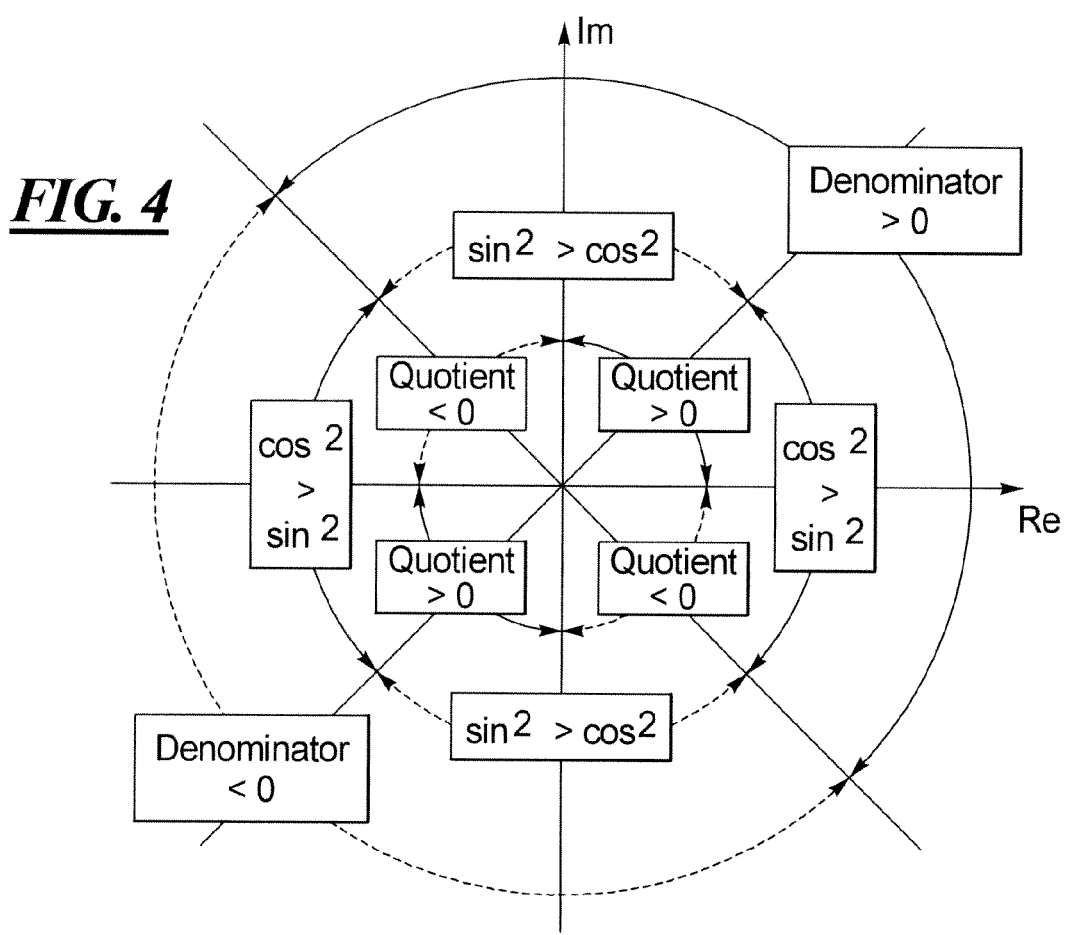
FIG. 4 illustrates criteria for the octant determination.

The eight octants can thereby (as indicated in FIG. 4) be differentiated. The angle is thus expanded in four steps:

1. If the quotient according to Equation (7) is negative, the algebraic sign of the angle is inverted (−45°< angle<+45°).
2. If $\sin^2 > \cos^2$ is valid, the difference 90° angle is calculated (−45°<angle<135°).
3. If the denominator of the quotient is negative, an angle of 180° is added (−45°<angle<315°).
4. The difference from the last position is calculated and subsequently added up. The angle thereby theoretically runs continuously (or until the data type overflows).

Figure 5:
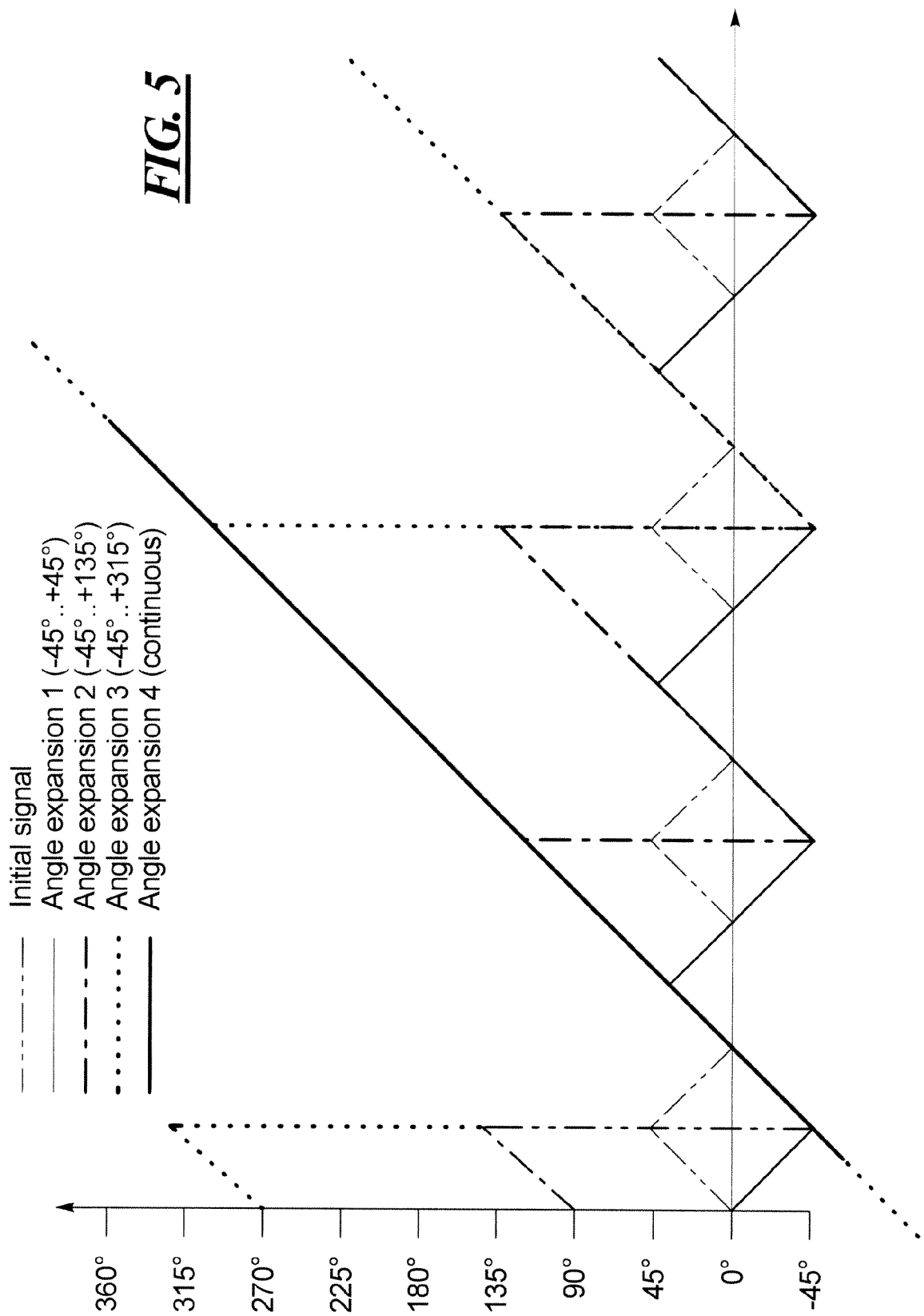
FIG. 5 shows the determination of the relative position in the correct octants.

FIG. 5 shows the angle of the expansion steps for a resolver rotating with constant rotation speed. It is visible that a jump could first occur at the third expansion step. This expansion step is therefore advantageously placed not at 180° but rather at 135° since here the inversion of the phase can be detected for S1 and S2 with approximately 70% certainty.

According to Equation (21), real part and imaginary part $$X_{Abw} = \frac{2\pi \cdot \cos\frac{2\pi}{N} \cdot Y_{DFT} - \left(2\pi \cdot \sin\frac{2\pi}{N} + 1\right) \cdot X_{DFT}}{4\pi^2 - 1}$$

$$Y_{Abw} = \frac{2\pi \cdot \cos\frac{2\pi}{N} \cdot X_{DFT} + \left(2\pi \cdot \sin\frac{2\pi}{N} - 1\right) \cdot Y_{DFT}}{4\pi^2 - 1}$$

of a complex compensation vector are calculated from the difference $X_{DFT} + i \cdot Y_{DFT}$ of the uncompensated current Fourier coefficient and the already-compensated preceding Fourier coefficient. Except for $X_{DFT}$ and $Y_{DFT}$, these are hereby only constants. The calculation is therefore very simply designed, quick and precise.

The current (complex) Fourier coefficients that are determined according to Equation (6) from the sampled values of the signals $U_{S1}(t)$, $U_{S2}(t)$ are subsequently corrected with the corresponding compensation vector, and the relative position ρ of the rotor relative to the stator windings (i.e. the relative position of the resolver) is determined from these corrected Fourier coefficients according to Equation (7) as described in the preceding.

Figure 6:
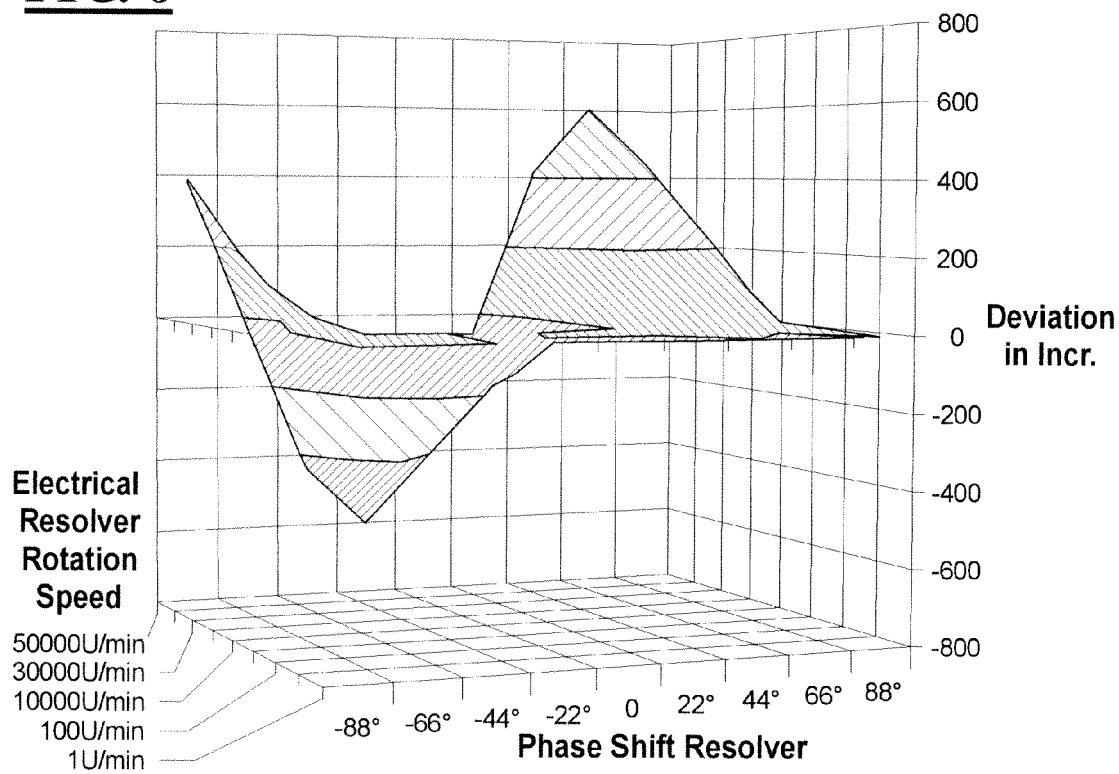
FIG. 6 shows the deviation that occurs for different resolver phase shifts and rotation speeds.
Figure 7:
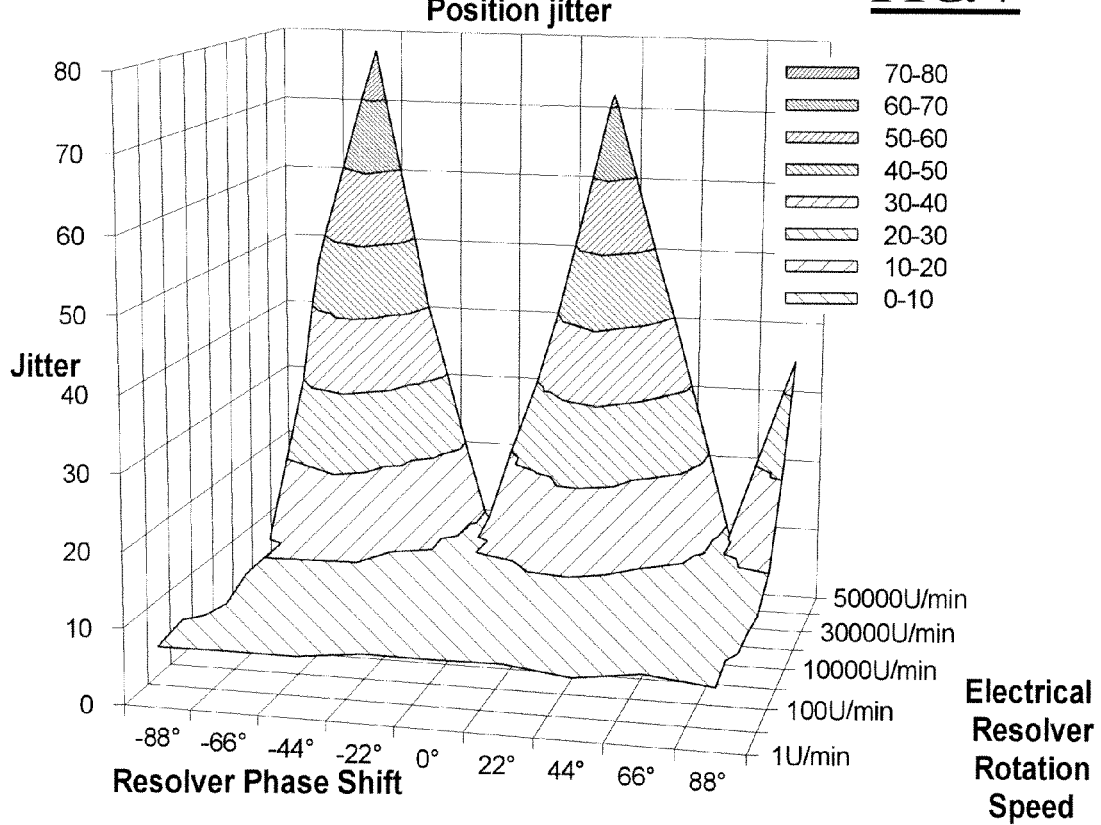
FIG. 7 shows position jitter given different resolver phase shifts and rotation speeds.
Figure 8:
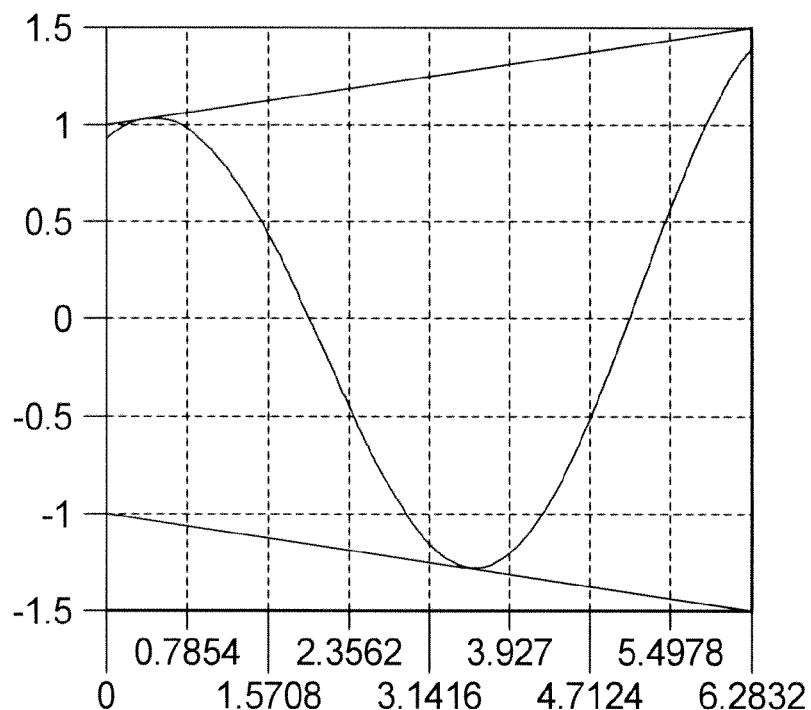
FIG. 8 shows signals of different phase with identical envelope.
Figure 8:
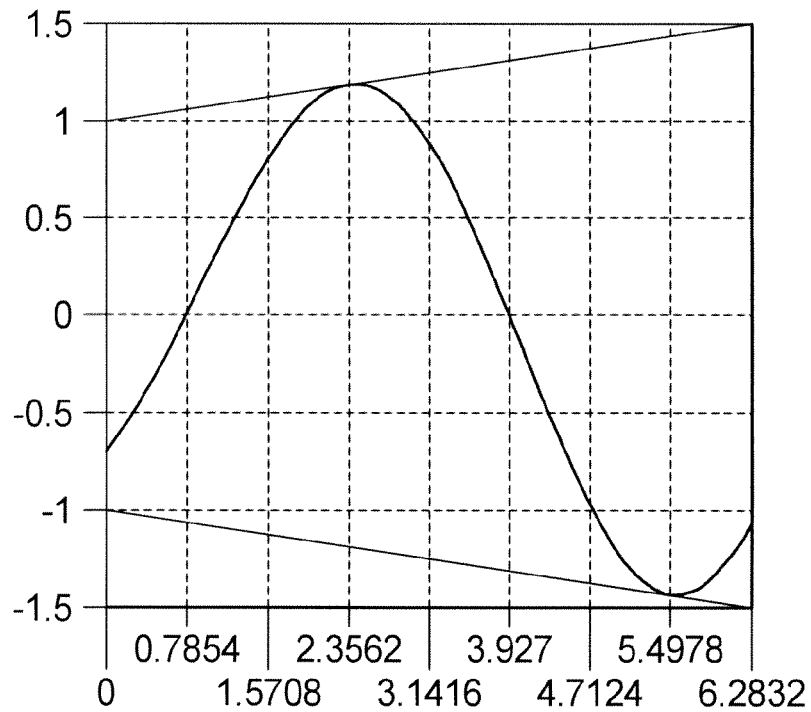
Figure 9:
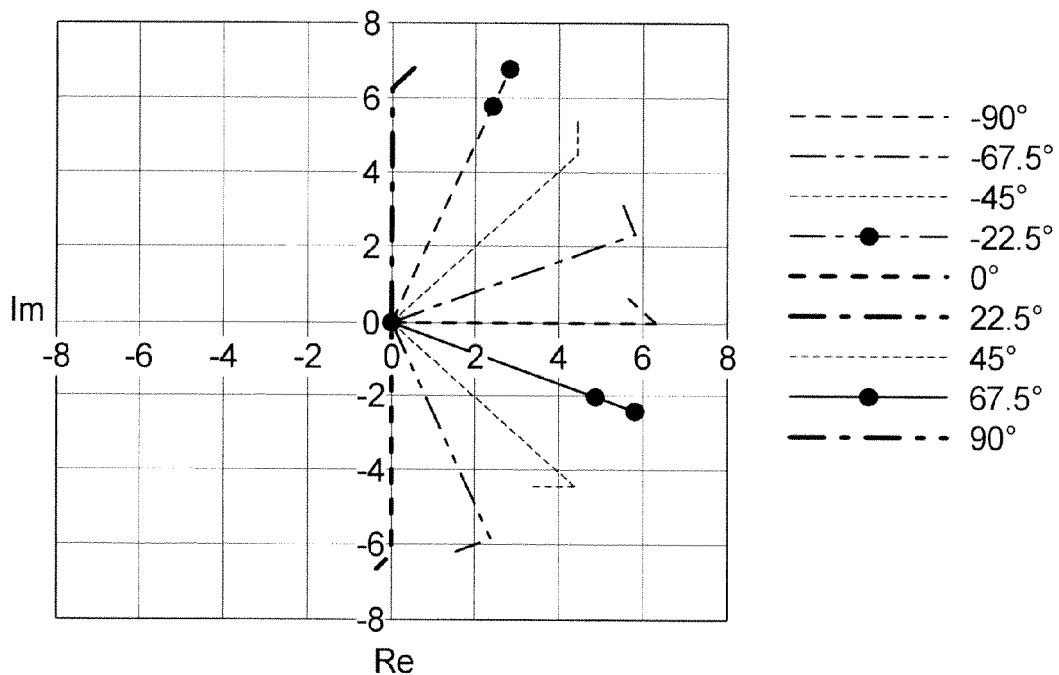
FIG. 9 shows the direction of usable portion and deviation for different resolver phase shifts.
Figure 10:
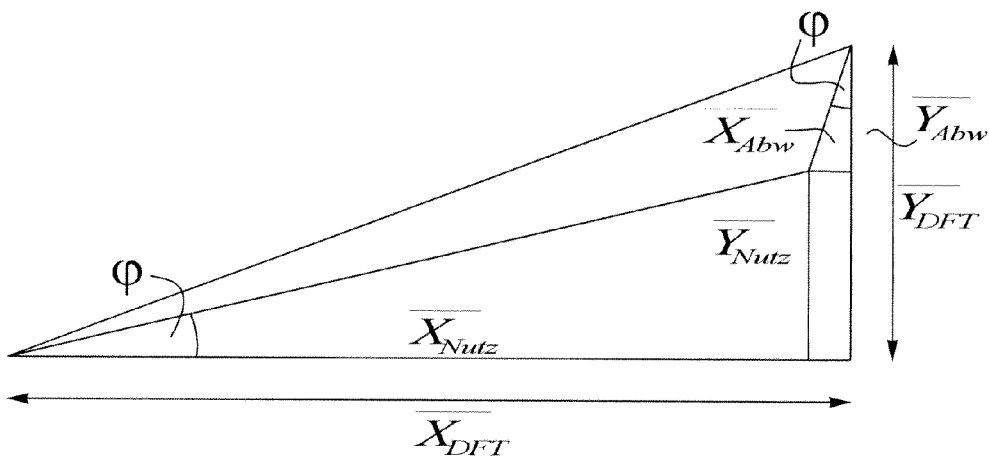
FIG. 10 illustrates the calculation of the compensation.
Figure 11:
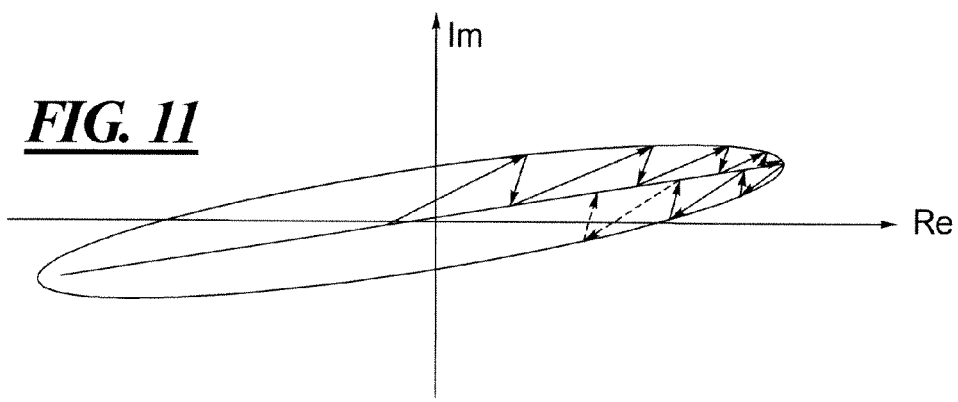
FIG. 11 illustrates compensation according to the invention.
Figure 12:
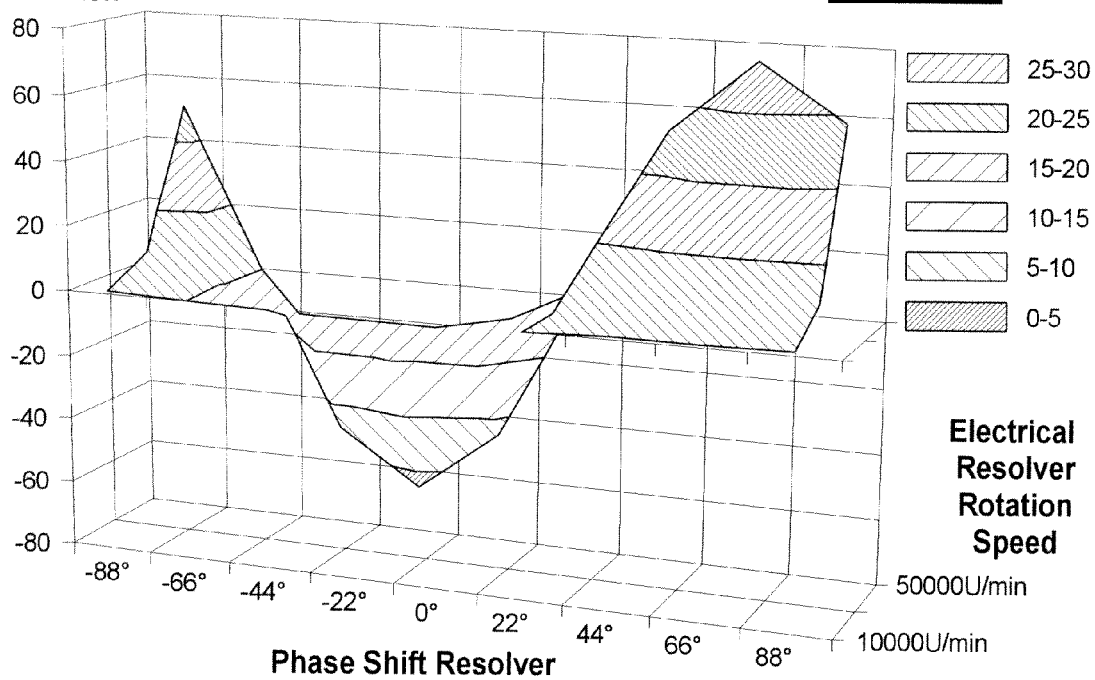
FIG. 12 shows the position deviation after a correction according to the invention.
Figure 13:
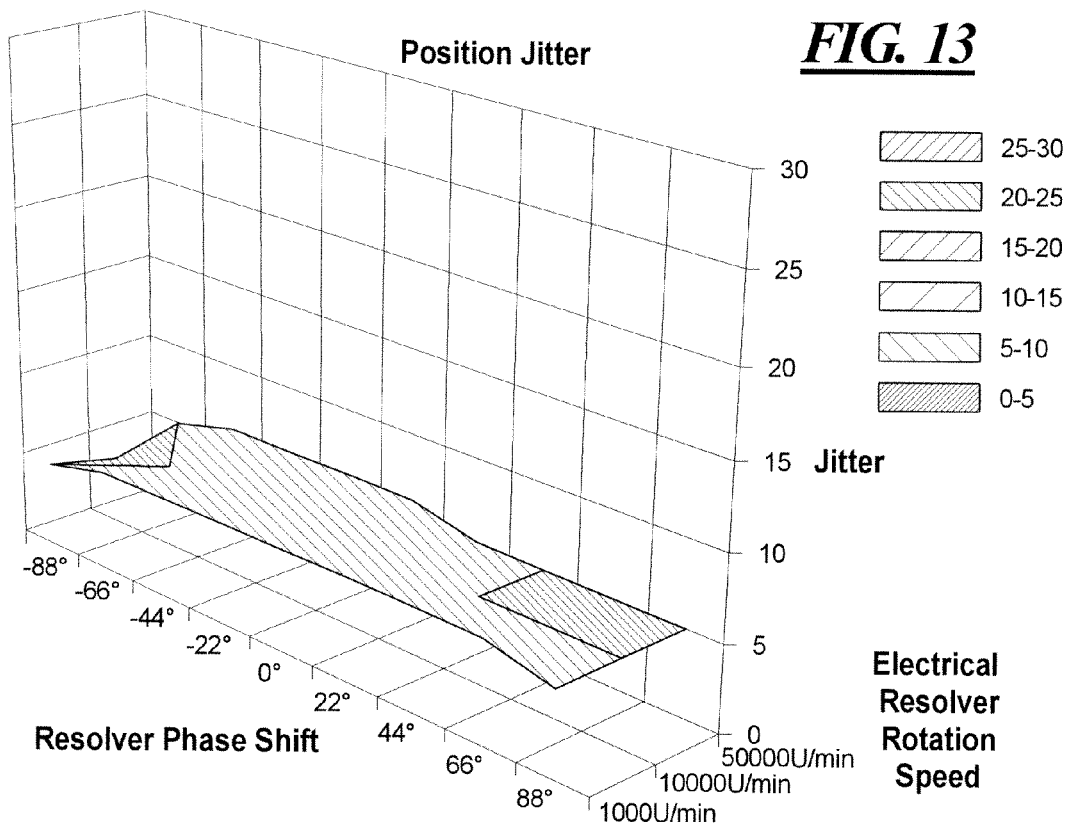
FIG. 13 shows the position jitter after a correction according to the invention.

For example, the Fourier coefficient given a stationary resolver (at which—as is recognizable from FIGS. 6 and 7—the deviation essentially disappears—can be selected as a first preceding Fourier coefficient.

Although modifications and changes may be suggested by those skilled in the art, it is the intention of the inventors to embody within the patent warranted hereon all changes and modifications as reasonably and properly come within the scope of their contribution to the art.

I claim as my invention:

1. A method to determine a relative position (ρ) of a resolver comprising the steps of:
   exciting an exciter winding of a resolver with a reference signal U(t);
   sampling a first signal $U_{S1}(t)$ resulting from the reference signal in a first winding of the resolver and sampling a second signal $U_{S2}(t)$ resulting from the reference signal in a second winding of the resolver;
   in a processor, determining an uncompensated Fourier coefficient $z_{S1}$ for the first signal $U_{S1}(t)$ and an uncompensated Fourier coefficient $z_{S2}$ for the second signal $U_{S2}(t)$; and
   in said processor, determining a compensated Fourier coefficient $z_{S1,com}$ for the first signal $U_{S1}(t)$ and a compensated Fourier coefficient $Z_{S2,com}$ for the second signal $U_{S2}(t)$ that essentially compensate a change of the uncompensated Fourier coefficients $z_{S1}, z_{S2}$ that is due to at least one of a phase shift of the resolver and a change of the relative position during said sampling.

2. A method as claimed in claim 1 comprising exciting said exciter winding with a reference signal that is periodic.

3. A method as claimed in claim 1 comprising exciting said exciter winding with a reference signal ($U(t)=U_R \cdot \sin(2\pi \cdot f \cdot t)$).

4. A method as claimed in claim 3 comprising sampling each of said first signal and said second signal with a frequency that is greater than 2f.

5. A method as claimed in claim 1 comprising exciting said exciter winding with a periodic signal having a period, and sampling each of said first signal and said second signal n-times during said period of said reference signal, n≧, and using n-th Fourier coefficients as each of said uncompensated Fourier coefficients $z_{S1}$ and $Z_{S2}$.

6. A method as claimed in claim 1 comprising, in said processor, determining said relative position of said resolver from a quotient of $z_{S1}$,com and $z_{S2}$, com.

7. A method as claimed in claim 6 comprising, in said processor, determining said relative position of said resolver as the arctangent of said quotient.

8. A method as claimed in claim 1 comprising initially determining a reference relative position of said resolver in a reference octant, and subsequently converting said reference relative position into said relative position of said resolver in an octant of an angle range representing a complete rotation of said resolver.

9. A method as claimed in claim 1 comprising approximating said at least one of said phase shift and said change of said relative position during said sampling as an envelope, selected from the group consisting of a linear envelope, selected from the group consisting of a linear envelope and a triggermetric envelope, when compensating said change of said uncompensated Fourier coefficients $z_{S1}$ and $Z_{S2}$.

10. A method as claimed in claim 1 comprising, in a current sampling period, determining, for each of said first signal and said second signal, the compensated Fourier coefficient therefor as a difference of the uncompensated Fourier coefficient therefor and the compensated coefficient therefor determined in a preceding sampling time period that precedes said current sampling period.

11. A method as claimed in claim 10 comprising employing, as said preceding sampling time period, at least one of said sampling periods.

12. A method as claimed in claim 10 wherein each of said first and second signals is a periodic signal having a period, and employing, as said sampling time period, one-half of said period of said first and second signals.

13. A device to determine a relative position (ρ) of a resolver comprising:
   a signal source that excite an exciter winding of a resolver with a reference signal U(t);
   a processor configured to sample a first signal $U_{S1}(t)$ resulting from the reference signal in a first winding of the resolver and to sample a second signal $U_{S2}(t)$ resulting from the reference signal in a second winding of the resolver;
   said processor being configured to determine an uncompensated Fourier coefficient $z_{S1}$ for the first signal $U_{S1}(t)$ and an uncompensated Fourier coefficient $z_{S2}$ for the second signal $U_{S2}(t)$; and
   said processor being configured to determine a compensated Fourier coefficient $z_{S1,com}$ for the first signal $U_{S1}(t)$ and a compensated Fourier coefficient $z_{S2,\ com}$ for the second signal $U_{S2}(t)$ that essentially compensate a change of the uncompensated Fourier coefficients $z_{S1}$, $z_{S2}$ that is due to at least one of a phase shift of the resolver and a change of the relative position during said sampling.

14. A non-transitory computer-readable storage medium encoded with programming instructions for determining a relative position (ρ)of a resolver having an exciter winding that is excited with a reference (U(t), said storage medium being loadable into a processor and said programming instructions causing said processor to:
   sample a first signal $U_{S1}(t)$ resulting from the reference signal in a first winding of the resolver and sample a second signal $U_{S2}(t)$ resulting from the reference signal in a second winding of the resolver;
   determine an uncompensated Fourier coefficient $z_{S1}$ for the first signal $U_{S1}(t)$ and an uncompensated Fourier coefficient $z_{S2}$ for the second signal $U_{S2}(t)$; and
   determine a compensated Fourier coefficient $z_{S1,com}$ for the first signal $U_{S1}(t)$ and a compensated Fourier coefficient $z_{S2,com}$ for the second signal $U_{S2}(t)$ that essentially compensate a change of the uncompensated Fourier coefficients $z_{S1}$, $z_{S2}$ that is due to at least one of a phase shift of the resolver and a change of the relative position during said sampling.

* * * * *